United States Patent [19]
Hileman et al.

[11] Patent Number: 5,751,551
[45] Date of Patent: May 12, 1998

[54] UNIVERSAL HARD DRIVE BRACKET WITH SHOCK AND VIBRATIONAL ISOLATION AND ELECTRICAL GROUNDING

[75] Inventors: Vince Hileman, San Jose; Khim H. Foo, Palo Alto, both of Calif.

[73] Assignee: Sun Microsystems, Inc., Mountain View, Calif.

[21] Appl. No.: 554,679

[22] Filed: Nov. 7, 1995

[51] Int. Cl.$^6$ .................... F16M 13/00; H05K 5/00
[52] U.S. Cl. .................... 361/753; 361/741; 361/754; 439/377; 248/634
[58] Field of Search .................... 361/737, 753, 361/758, 798, 799, 818, 732, 741, 754; 439/377, 64, 92, 108, 95, 97, 327, 155, 157; 248/611, 634

[56] References Cited

U.S. PATENT DOCUMENTS

| | | | |
|---|---|---|---|
| 4,705,257 | 11/1987 | Leo et al. | 248/611 |
| 4,937,806 | 6/1990 | Babson et al. | 369/75.1 |
| 5,262,923 | 11/1993 | Batta et al. | 361/685 |
| 5,283,713 | 2/1994 | Nagafuji et al. | 361/796 |

FOREIGN PATENT DOCUMENTS 2 137 819  10/1984  United Kingdom .................... 361/684

*Primary Examiner*—Leo P. Picard
*Assistant Examiner*—Jayprakash N. Gandhi
*Attorney, Agent, or Firm*—Blakely Sokoloff Taylor & Zafman

[57] ABSTRACT

A bracket for an electronic card that is inserted into a slot of a chassis. The chassis has a pair of opposing walls with guide channels that guide the card into a motherboard. The bracket includes a pair of low friction guide rails that slide along the guide channels. Attached to the guide rails are a pair of grommet dampers which are pressed between the edges of the card and the guide channels when the card is inserted into the chassis. The grommets dampen any shock or vibrational load that is transferred from the chassis to the card. The bracket also has a pair of spring clips that are attached to the card and pressed into the guide channels to provide an electrical path between the card and the chassis. The electrical path discharges electrostatic charges on the card and provides a ground path for any electromagnetic fields generated or received by the card. The bracket further includes a lever pivotally connected to one of the guide rails. The lever has a latch that can engage the chassis to secure the card in the installed position. The lever has rounded edges and a width no greater than the thickness of the card to allow cooling air to readily flow past the card. The pivot point of the lever is located above the card so that the bracket may be assembled to cards of various lengths.

20 Claims, 2 Drawing Sheets

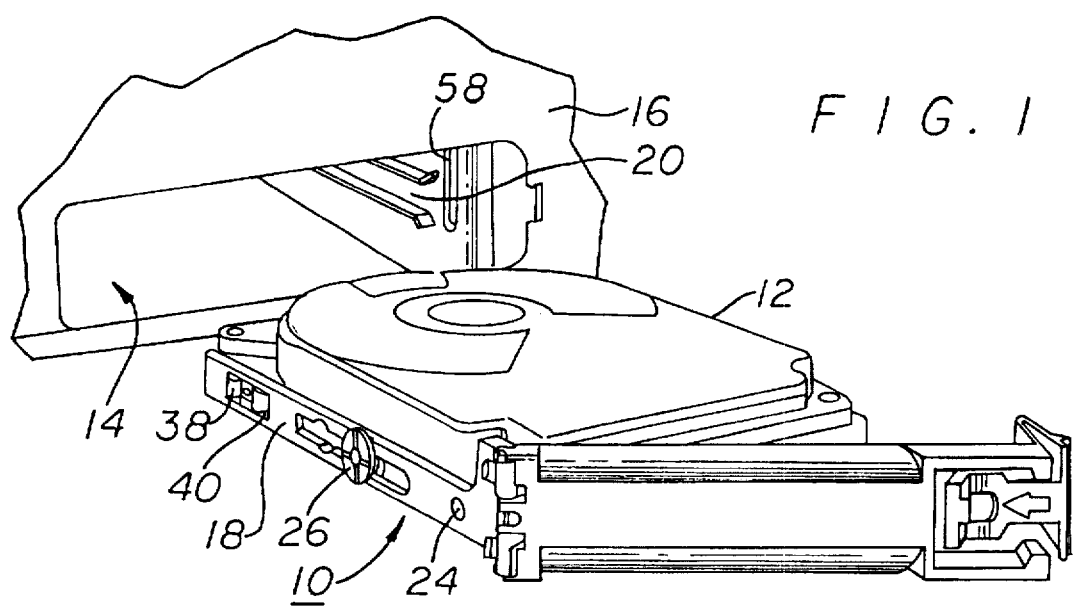
FIG. 1
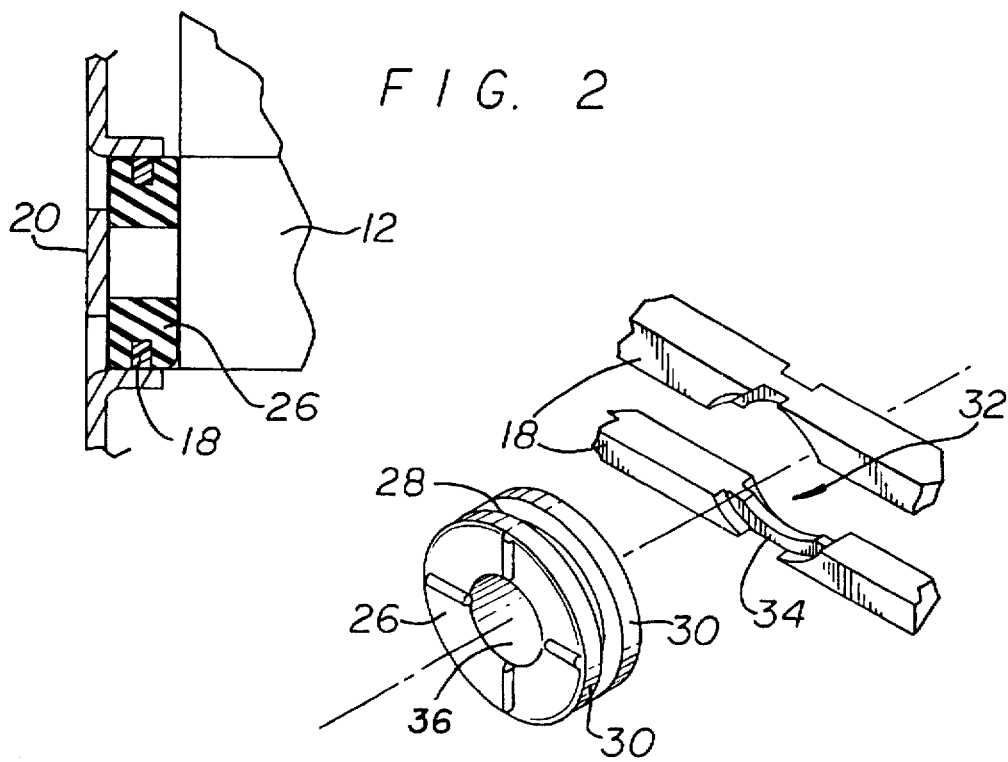
FIG. 2
FIG. 3

UNIVERSAL HARD DRIVE BRACKET WITH SHOCK AND VIBRATIONAL ISOLATION AND ELECTRICAL GROUNDING

BACKGROUND OF THE INVENTION

1. Field of the Invention

The present invention relates to a bracket for an electronic card.

2. Description of the Related Art

Electronic cards are typically plugged into a motherboard located within a mechanical chassis. The cards have electrical connectors that are plugged into mating connectors mounted to the motherboard. The chassis may have guide channels that receive the edges of the card and align the card connector with the motherboard connector. The electronic cards are typically installed by sliding the cards along the guide channels and pushing the card connector into the motherboard connector.

The guide channels are typically constructed to be wider than the edges of the card to minimize the insertion force required to install the card into the chassis. The wider channels create spaces between the chassis and the edges of the card. The excess spaces allow the cards to rattle if the chassis is subjected to a shock or vibrational load. Shock and vibration loads are common when the chassis and installed cards are shipped from the manufacturing site. Excessive shock loads may damage the card and/or components on the card. It would therefore be desirable to provide an electronic card assembly that will dampen shock loads that are applied to the chassis and transferred to the card.

U.S. Pat. No. 5,283,713 issued to Nagafuji et al. and assigned to NEC, Corp. ("NEC"), discloses a bracket for an electronic card. The NEC bracket has a rotating lever which allows the end user to remove the card from a chassis slot. The lever has a latch that engages the chassis to secure the card in the inserted position. The assignee of the present invention Sun Microsystems, Inc., has also sold a bracket with a latching lever. The Sun bracket is disclosed in U.S. Ser. No. 08/384,374 now abandoned.

The latching levers of the prior art both have pivot points that are below the top surface of the electronic card. A pivot point below the electronic card requires the card to be as long as the chassis to prevent an interference between the rotated lever and the chassis. The brackets of the prior art can therefore only be used with cards that have a length which was at least the depth of the chassis slot. Additionally, the levers of the prior art are wider than the thickness of the electronic cards. The additional lever width impedes the flow of cooling air directed across the length of the cards. It would be desirable to provide a bracket that can be used with electronic cards of various lengths and which allows cooling air to efficiently flow across the cards.

When an electronic card is installed into a chassis, it is desirable to discharge any electrostatic charge on the card before the card connector is mated to the motherboard and coupled to the other components of the computer. Additionally, it is desirable to electrically ground the card to the chassis to reduce the amount of electromagnetic interference between the card and the other components of the computer. It would therefore be desirable to provide an electronic card assembly that can be used with different length cards, isolated the card from shock loads, minimized air flow resistance and electrically grounded the card to the chassis.

SUMMARY OF THE INVENTION

The present invention is a bracket for an electronic card that is inserted into a slot of a chassis. The chassis has a pair of opposing walls with guide channels that guide the card into a motherboard. The bracket includes a pair of low friction guide rails that slide along the guide channels. Attached to the guide rails are a pair of grommet dampers which are pressed between the edges of the card and the guide channels when the card in inserted into the chassis. The grommets dampen any shock or vibrational load that is transferred from the chassis to the card. The bracket also has a pair of spring clips that are attached to the card and pressed into the guide channels to provide an electrical path between the card and the chassis. The electrical path discharges electrostatic charges on the card and provides a ground path for any electromagnetic fields generated or received by the card. The bracket further includes a lever pivotally connected to one of the guide rails. The lever has a latch that can engage the chassis to secure the card in the installed position. The lever has rounded edges and a width no greater than the thickness of the card to allow cooling air to readily flow past the card. The pivot point of the lever is located above the card so that the bracket may be assembled to cards of various lengths.

BRIEF DESCRIPTION OF THE DRAWINGS

The objects and advantages of the present invention will become more readily apparent to those ordinarily skilled in the art after reviewing the following detailed description and accompanying drawings, wherein:

FIG. 1 is a perspective view of a bracket for an electronic card that can be plugged into a computer chassis;

FIG. 2 is a side view showing a damping grommet pressed between an electronic card and a chassis;

FIG. 3 is an exploded view of the grommet and a guide rail;

DETAILED DESCRIPTION OF THE INVENTION

Figure 4:
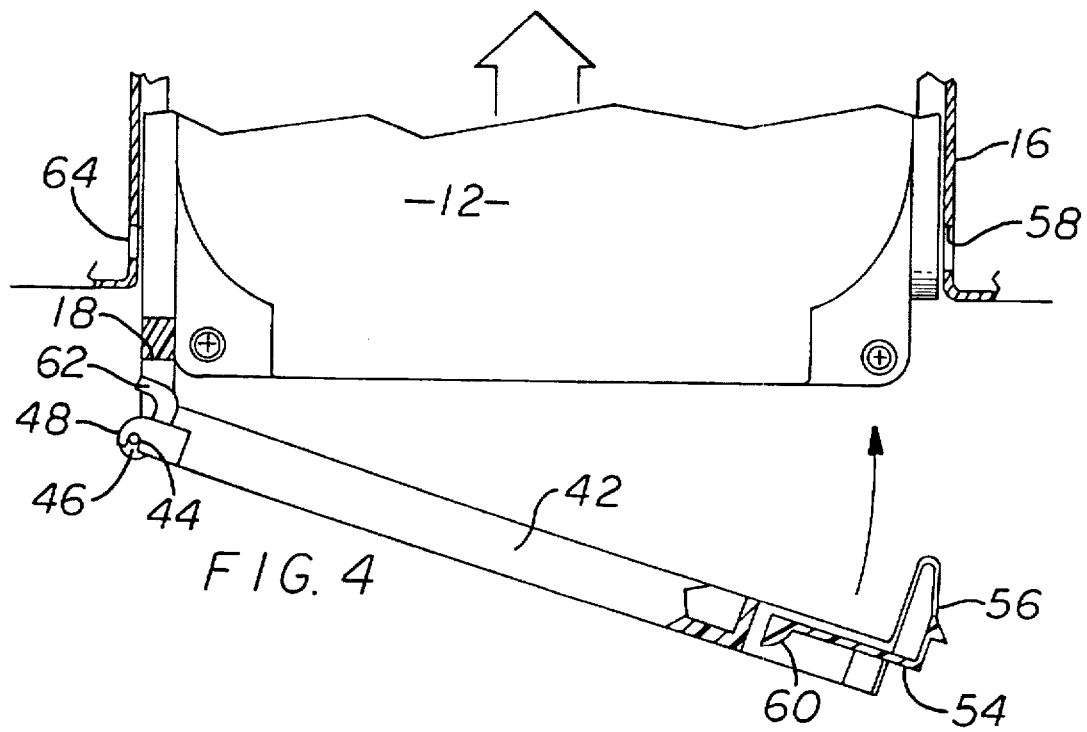
FIG. 4 is a side view of a bracket lever in an open position.

Referring to the drawings more particularly by reference numbers, FIG. 1 shows a bracket 10 for an electronic card 12 that can be inserted into a slot 14 of a computer chassis 16. The electronic card 12 is typically a hard disk assembly (HDA). The bracket 10 guides the card 12 into the computer 16 and secures the installed card 12 to the chassis 16. The bracket 10 also facilitates the removal of the card from the computer chassis 16.

The bracket 10 includes a pair of guide rails 18 located on each side of the card 12. The guide rails 18 slide along guide channels 20 of the chassis 16 to align a connector of the card 12 with a corresponding motherboard connector (not shown) within the slot 14 of the chassis 16. The guide rails 18 are preferably constructed as separate pieces molded from a plastic material which has a low friction coefficient. In the preferred embodiment, the guide rails 18 are molded from an acetyl based material such as the material sold under the trademark DELRIN. The guide rails 18 may be secured to the card 12 by fasteners 24.

As shown in FIG. 2, attached to each guide rail 18 is a damping grommet 26 that is pressed between the card 12 and the guide channel 20. There is a grommet 26 located on each side of the card 12. The grommets 26 dampen shock or vibrational loads transferred from the chassis 16 to the card 12. The grommets 26 are preferably constructed from a molded plastic that contains damping material. In the preferred embodiment, the damping grommets 26 are products sold by EAR of Indianapolis, Indiana under the part designation EAR Isodamp 1100.

As shown in FIG. 3, the grommets 26 each have an annular groove 28 that separate a pair of annular rims 30. The grommets 26 are pushed into slots 32 of the guide rails 18 until lip members 34 of the rails 24 are inserted into the annular grooves 28. The annular rims 30 capture the lip members 34 to secure the grommets 26 to the guide rails 18. The grommets 26 each have inner apertures 36 that provide space for the grommet material to flow into, when the grommets 26 are pressed between the card 12 and the chassis 16. The apertures 36 lower the spring rate and increase the defection of the grommets 26.

Referring to FIG. 1, the bracket assembly 10 includes a pair of metal spring clips 38 that are attached to the electronic card 12. The guide rails 18 have openings 40 that allow the clips 38 to come into contact with the edges of the card 12. The spring clips 38 are pressed into the guide channels 20 when the card 12 is inserted into the chassis 16. The spring clips 38 provide an electrical path between the card 12 and the chassis 16. In the preferred embodiment, the spring clips 38 and chassis 16 are constructed from a metal material.

When the card 12 is initially inserted into the chassis 16, the spring clips 38 are pressed into the guide channels 20 and card 12. The contact between the card 12, clips 38 and guide channels 20 allow any static charge on the card 12 to be grounded to the chassis 16. Additionally, the springs clips 38 provide an electrical ground path for the card 12. The electrical ground path may reduce the amount of electromagnetic interference generated and received by the card 12.

As shown in FIG. 4, the bracket 10 includes a lever 42 that is pivotally connected to one of the guide rails 18. The lever 42 pivots about a pin 44 that is pressed into sleeves 46 of the guide rail 18. The lever 42 has sleeve and ear members 48 that rotate about the pin 44. Opposite from the pin 44 is a latch 54 integrally formed within the lever 42.

Figure 5:
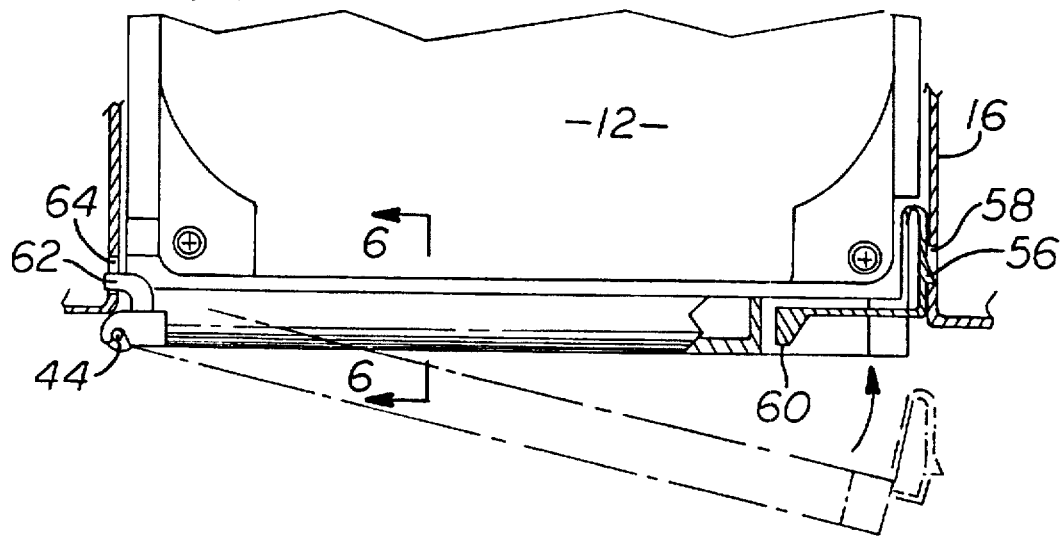
FIG. 5 is a side view of the lever attached to the chassis.

As shown in FIG. 5, the latch 54 has a U-shaped lip 56 that extends into a corresponding slot 58 of the chassis 16. The lip 56 and slot 58 secure the lever 42 and prevent the card 12 from being pulled away from the motherboard by a shock or vibrational load. The lip 56 is connected to a button 60 that can be depressed by an end user to disengage the latch 54 from the chassis 16. The button 60 is located away from the edge of the card so that the end user can place a finger on the button 60 without interference from the chassis 16. The lever 42 may also have a pair of tabs 62 that extend into corresponding chassis slots 64 that are located adjacent to the pin 44. The tabs 62 and slots 64 further secure the card 62 to the chassis 64.

When the latch 54 is disengaged from the chassis 16 the lever 42 can be rotated to an open position. The end user can then pull the card 12 out of the chassis 16. The pivot point of the lever 42 is located away from the top of the card so that the chassis 16 does not interfere with the rotation of the lever 42. Placing the pivot point away from the card allows the bracket assembly 10 to be mounted to cards that have different lengths. For example, for a chassis slot depth of approximately 2.0 inches, the bracket 10 may be used with a 1.6 inch long card, or a 1.0 inch card.

Figure 6:
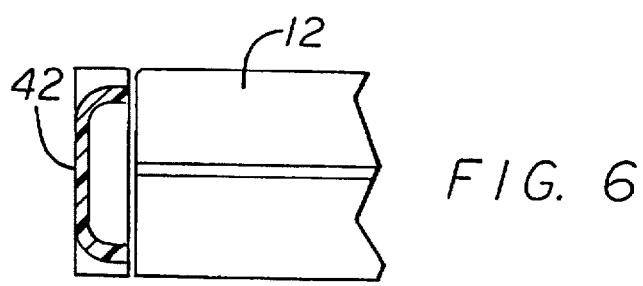
FIG. 6 is a sectional view of the lever and the electronic card taken at line 6—6 of FIG. 5.

As shown in FIG. 6, the width of the lever 42 is no greater than the thickness of the electronic card 12. The lever thickness allows cooling air to more readily flow across the card, particularly when two or more cards are installed adjacent to each other within the chassis 16. The edges of the lever 42 are also rounded to improve the air flow past the lever 42.

In operation, the electronic card 12 is placed into the chassis slot 14 so that the guide rails 18 are aligned with a pair of guide channels 20. The card 12 is then pushed into the chassis 16. The spring clips 38 are pressed into the guide channels 20 to discharge any electrostatic charge on the card 12. The card 12 is pushed into the chassis 16 until the card connector mates with the motherboard connector.

The lever 42 is pushed downward to insure that the latch 54 is engaged with the chassis slot 58 to secure the card 12. The grommets 26 are also pressed into the guide channels 20 to further secure the card. When the computer is shipped from the assembly site, the chassis 16 may be subjected to shock or vibration loads that are transferred to the card 12. The latch 54 restrains the card 12 to insure that the connectors do not become separated. Additionally, the grommets 26 dampen the shock loads to prevent, or at least reduce, the likelihood of damage to the card 12. The card 12 can be removed from the chassis by depressing the button 60 to disengage the latch 54. The lever 42 is then rotated so that the card 12 can be pulled away from the motherboard.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. An electronic card assembly that is inserted into a chassis, wherein the chassis can be subjected to a shock load that is transferred to the electronic card assembly, comprising:

an electronic card that has a pair of opposing edges;

a pair of guide rails that are attached to said edges of said electronic card, said guide rails each have a lip located within a slot; and, a pair of damping members that each have an annular groove that receives said lip of said guide rail and is attached to an edge of said electronic card, said damping members are pressed between the chassis and said edges to dampen a shock load that may be transferred to said electronic card from the chassis.

2. The assembly as recited in claim 1, further comprising a metal spring clip that is attached to an edge of said electronic card and which engages the chassis to provide an electrical path between said electronic card and the chassis.

3. The assembly as recited in claim 1, wherein said damping members are each configured as a grommet that has an inner aperture.

4. The assembly as recited in claim 1, further comprising a lever that is pivotally connected to one of said guide rails, said lever having a latch that cooperates with the chassis to secure said electronic card when said electronic card is inserted into the chassis.

5. The assembly as recited in claim 4, wherein said latch contains a button that is depressed to disengage said latch from the chassis.

6. The assembly as recited in claim 5, wherein said lever has a width that is no greater than a thickness of said electronic card.

7. The assembly as recited in claim 6, wherein said lever has a pair of rounded edges extending along a longitudinal axis of said lever.

8. The assembly as recited in claim 4, wherein said lever pivots about a point that is separated a distance away from a top surface of said electronic card.

9. A bracket for an electronic card that is inserted into a chassis that has a latch slot, wherein the electronic card has a top surface, a thickness and a pair of opposing edges, comprising:

a lever pivotally connected to the electronic card, said lever having a latch that engages the latch slot to secure the electronic card, said lever pivots about a point that is separated a distance away from the top surface of the electronic card and has a width that is no greater than the thickness of the electronic card.

10. The bracket as recited in claim 14, wherein said lever has a pair of rounded edges extending along a longitudinal axis of said lever.

11. The bracket as recited in claim 10, further comprising a pair of guide rails that are attached to the edges of the electronic card.

12. The bracket as recited in claim 11, further comprising a pair of damping grommets attached to said guide rails, said damping grommets are pressed between the electronic card and the chassis and dampen a shock load that may be applied to the chassis and transferred to the electronic card.

13. The bracket as recited in claim 12, further comprising a metal spring clip that is attached to an edge of the electronic card and which engages the chassis to provide an electrical path between the electronic card and the chassis.

14. The bracket as recited in claim 13, wherein said latch contains a button that is depressed to disengage said latch from the latch slot.

15. A bracket for an electronic card that is inserted into a chassis that has a latch slot, wherein the electronic card has a thickness and a pair of opposing edges, comprising:

a lever pivotally connected to the electronic card, said lever having a latch that engages the latch slot to secure the electronic card, said lever having a width that is no greater than the thickness of the electronic card.

16. The bracket as recited in claim 15, wherein said lever has a pair of rounded edges extending along a longitudinal axis of said lever.

17. The bracket as recited in claim 16, wherein said latch contains a button that is depressed to disengage said latch from the latch slot.

18. The bracket as recited in claim 17, further comprising a pair of guide rails that are attached to the edges of the electronic card.

19. The bracket as recited in claim 18, further comprising a pair of damping grommets attached to said guide rails, said damping grommets are pressed between the electronic card and the chassis and dampen a shock load that may be applied to the chassis and transferred to the electronic card.

20. The bracket as recited in claim 19, further comprising a metal spring clip that is attached to an edge of the electronic card and which engages the chassis to provide an electrical path between the electronic card and the chassis.

* * * * *